United States Patent [19]

Imai

[11] Patent Number: 4,629,539

[45] Date of Patent: Dec. 16, 1986

[54] METAL LAYER PATTERNING METHOD

[75] Inventor: Yuji Imai, Chiba, Japan

[73] Assignee: TDK Corporation, Tokyo, Japan

[21] Appl. No.: 511,403

[22] Filed: Jul. 7, 1983

[30] Foreign Application Priority Data

| | | | |
|---|---|---|---|
| Jul. 8, 1982 | [JP] | Japan | 57-118887 |
| Nov. 30, 1982 | [JP] | Japan | 57-210466 |
| Nov. 30, 1982 | [JP] | Japan | 57-210467 |
| Nov. 30, 1982 | [JP] | Japan | 57-210468 |
| Nov. 30, 1982 | [JP] | Japan | 57-210469 |
| Nov. 30, 1982 | [JP] | Japan | 57-210470 |
| Nov. 30, 1982 | [JP] | Japan | 57-210471 |
| Nov. 30, 1982 | [JP] | Japan | 57-210472 |
| Nov. 30, 1982 | [JP] | Japan | 57-210473 |
| Dec. 20, 1982 | [JP] | Japan | 57-223551 |
| Dec. 20, 1982 | [JP] | Japan | 57-223552 |
| Dec. 20, 1982 | [JP] | Japan | 57-223553 |

[51] Int. Cl.$^4$ .............................................. C25F 3/14
[52] U.S. Cl. .......................... 204/129.65; 204/129.75; 204/129.95
[58] Field of Search ................ 204/15, 129.65, 129.75, 204/129.9, 129.95

[56] References Cited

U.S. PATENT DOCUMENTS

| | | | |
|---|---|---|---|
| 3,108,931 | 10/1963 | Wendell, Jr. | 204/15 |
| 3,260,660 | 7/1966 | Brooks | 204/129.95 X |
| 3,267,013 | 8/1966 | Mathias et al. | 204/129.65 X |
| 3,560,357 | 2/1971 | Shaw | 204/129.65 |
| 3,576,722 | 4/1971 | Fennimore et al. | 204/15 |
| 3,785,945 | 1/1974 | MacArthur | 204/129.75 X |
| 4,247,377 | 1/1981 | Eckler et al. | 204/129.65 |

*Primary Examiner*—Donald R. Valentine
*Attorney, Agent, or Firm*—Gerald J. Ferguson, Jr.; Michael P. Hoffman; Ronni S. Malamud

[57] ABSTRACT

A metal layer of aluminum, an aluminum-silicon alloy, aluminum-copper alloy, copper or chromium to be patterned is formed on an insulating substrate and a mask layer of a predetermined pattern is formed on the metal layer and then the metal layer is subjected to electrolytic etching by an electrolyte through the mask layer, forming a patterned metal layer.

When the metal layer is formed on aluminum, the electrolyte is an aqueous solution including a solute consisting principally of phosphoric acid; phosphoric acid and nitric acid; phosphoric acid, nitric acid and acetic acid; hydrochloric acid; potassium hydroxide; or sodium hydroxide.

When the metal layer is formed on the aluminum-silicon or aluminum-copper alloy, the electrolyte is an aqueous solution including a solute consisting principally of phosphoric acid; phosphoric acid and nitric acid; or phosphoric acid, nitric acid and acetic acid.

When the metal layer is formed of copper, the electrolyte is an aqueous solution including a solute consisting principally of sulfuric acid.

When the metal layer is formed chromium, the electrolyte is an aqueous solution including a solute consisting principally of drochloric acid.

A DC constant-current source is connected between the metal layer and an electrode corresponding thereto, and the electrolytic etching is carried out until voltage between metal layer and the electrode increases suddenly.

A DC constant-voltage source is connected between the metal layer and an electrode corresponding thereto, and the electrolytic etching is carried out until current flowing across the metal layer decreases suddenly.

18 Claims, 13 Drawing Figures

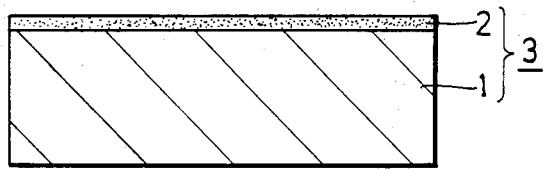
Fig. IA
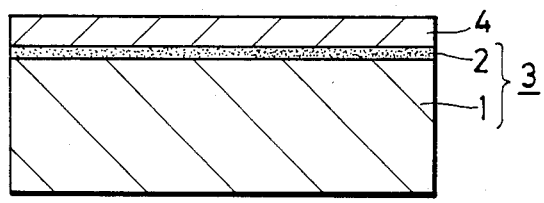
Fig. IB
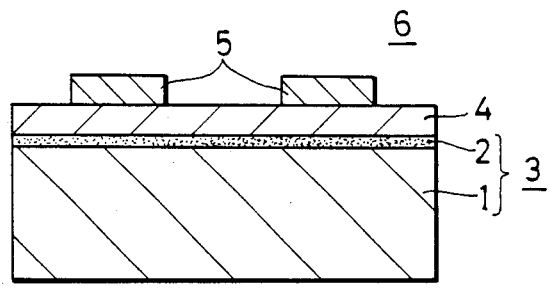
Fig. IC

METAL LAYER PATTERNING METHOD

BACKGROUND OF THE INVENTION

1. Field of the Invention

The present invention relates to a method for patterning a metal layer on an insulating substrate and, more particularly, to a metal layer patterning method which is suitable for use in forming interconnect layers of semiconductor integrated circuits or mask layers employed for the formation of such interconnect layers or the like in the fabrication of semiconductor integrated circuits.

2. Description of the Prior Art

The most common traditional way of forming an interconnect layer of a semiconductor integrated circuit by a metal layer as of aluminum, aluminum-silicon alloy, aluminum-copper alloy or copper and mask layer therefor by a metal layer as of chromium comprises the steps of forming on a semiconductor layer a metal layer to be patterned, forming a patterned mask layer of photoresost on the metal layer and carrying out chemical etching of the metal layer by an etchant through the mask layer for a predetermined period of time, thereby patterning the metal layer into the interconnect layer or mask layer desired to obtain.

With such a conventional method, however, during the abovesaid chemical etching the metal layer to be patterned is inevitably subjected to what is called side etching by an amount dependent upon the length of chemical etching, resulting in the patterned metal layer becoming smaller than the pattern of the mask layer by the amount of side etching.

It is desirable, of course, that the patterned metal layer be of the same pattern as that of the mask layer. The reason is that the metal layer can be obtained in a desired pattern only by forming the mask layer in the same pattern as that of the metal layer.

Even in the case where the metal layer is subjected to side etching in the aforementioned step of chemical etching, however, if the amount of side etching of the metal layer were predicatable, the metal layer could be obtained in the desired pattern by forming the mask layer in a pattern of a size larger than the predetermined pattern of the metal layer in anticipation of the amount of side etching predicted.

But, according to the aforesaid prior art method, since the amount of side etching depends upon the temperature, the flow rate and other conditions of the etchant used, it is very difficult to predict the amount of side etching.

Therefore, the aforementioned conventional method encounters difficulty in forming the metal layer in the desired pattern with good reproducibility and with high precision.

SUMMARY OF THE INVENTION

It is therefore an object of the present invention to provide a novel metal layer patterning method which is free from the abovesaid defect of the prior art.

The metal layer patterning method of the present invention comprises the steps of forming on an insulating substrate a metal layer to be patterned, forming a mask layer of a desired pattern on the metal layer and subjecting the metal layer to electrolytic etching through the mask layer to form a patterned metal layer desired to obtain.

With such a method of the present invention, the amount of side etching of the metal layer in the electrolytic etching can be predicted on the basis of the temperature of the electrolyte used and the density of current applied to the electrolyte.

It is therefore possible with the present invention to form the metal layer in a predetermined pattern with high precision and with ease.

According to another aspect of the present invention, the electrolytic etching is carried out at a current density above a value predetermined in relation to the temperature of the electrolyte used, by which the amount of side etching of the metal layer can be reduced to substantially zero.

According to another aspect of the present invention, the electrolytic etching employs a DC constant-current source and is carried out until a voltage between the metal layer to be patterned and the corresponding electrode rises abruptly. With such a method of the present invention, it is possible to obtain the metal layer in a predetermined pattern with excellent reproducibility, with high precision and with ease.

According to another aspect of the present invention, the electrolytic etching employs a DC constant-voltage source and is carried out until current flowing to the metal layer to be patterned decreases abruptly. With such a method of the present invention, it is possible, to obtain the metal layer in a predetermined pattern with excellent, with high precision and with ease.

Other objects, features and advantages of the present invention will become more fully apparent from the following detailed description taken in conjunction with the accompanying drawings.

BRIEF DESCRIPTION OF THE DRAWINGS

FIGS. 1A, B and C are cross-section views schematically illustrating a sequence of steps involved in the formation of a mask layer on a metal layer to be patterned according to the metal layer patterning method of the present invention;

DESCRIPTION OF THE PREFERRED EMBODIMENTS

Figure 2:
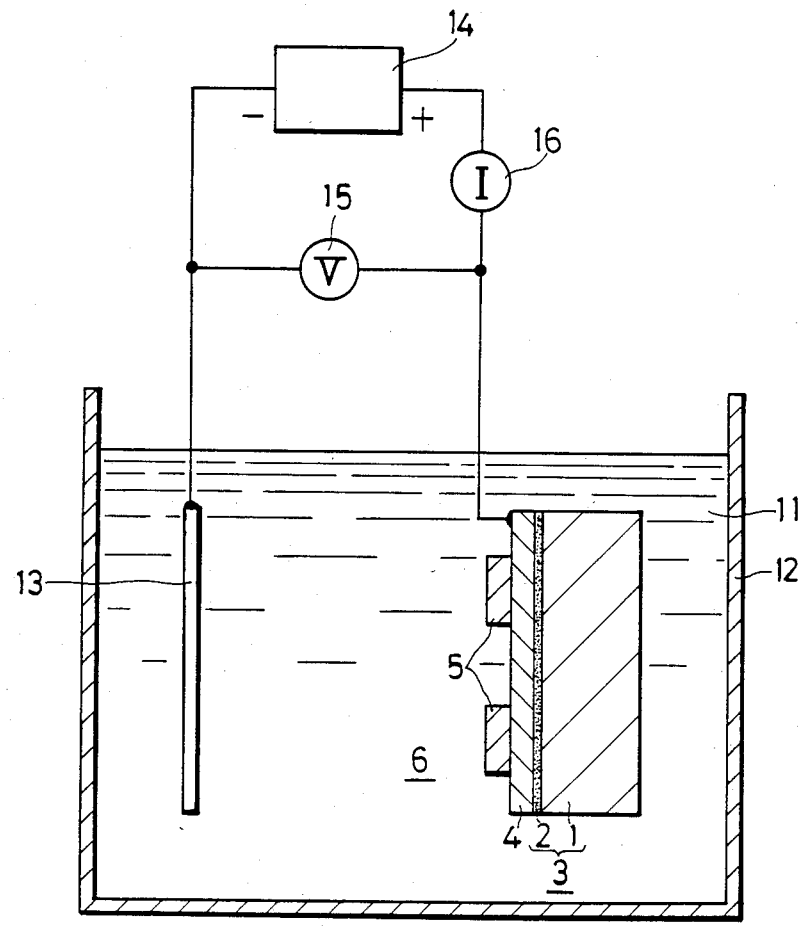
FIG. 2 is a schematic diagram showing the step of subjecting the metal layer to be patterned to electrolytic etching for patterning it according to the metal layer patterning method of the present invention.

According to the present invention, an insulating substrate 3 is prepared such, for example, as shown in FIG. 1A in which an insulating layer 2 as of silicon oxide ($SiO_2$) is formed on a substrate 1 as of silicon.

A metal layer 4 to be patterned is formed by known method, for instance, by vapor deposition on the insulating layer of the insulating substrate 3 as shown in FIG. 1B.

Then a patterned mask layer 5 as of photo resist is formed on the metal layer 4 as shown in FIG. 1C through a known method according to which a photo resist layer is formed on the metal layer 4, exposed to light through a photo mask and then developed.

In this way, a substrate assembly 6 is obtained in which the metal layer 4 to be patterned is formed on the insulating substrate 3 and the patterned mask layer 5 is formed on the metal layer 4.

In this case, the metal layer 4 can be formed as an aluminum, aluminum-silicon alloy, aluminum-copper alloy or copper layer which can be used as an interconnect layer, or as a chromium layer which can be used as the aforementioned mask layer.

The substrate assembly 6 thus obtained is immersed in an electrolyte 11 consisting of an acidic or alkaline aqueous solution in a cell 12 while holding the metal layer 4 in a substantially vertical direction as shown in FIG. 2. An electrode 13 as of platinum is placed in the cell 12 in opposing relation to the metal layer 4 of the substrate assembly 6. The metal layer 4 is connected at its unmasked area to the positive side of a DC power source 14 and the electrode 13 is connected to the negative side of the DC power source 14, by which the metal layer 4 is subjected to electrolyte etching with the electrolyte 11 through the mask layer 5.

In this case, the electrolyte 11 is selected in accordance with the material of the metal layer 4 as follows:

[1] When the metal layer 4 is formed of aluminum:
   (1) Acidic aqueous solution with a solute consisting principally of 50 to 85% phosphoric acid ($H_3PO_4$)
   (2) Acidic aqueous solution with a solute consisting principally of 15 to 20 parts by volume of 50 to 85% of phosphoric acid and 1 to 4 parts by volume of 30 to 60 % nitric acid ($HNO_3$)
   (3) Acidic aqueous solution with a solute consisting principally of 15 to 20 parts by volume of 50 to 85% phosphoric acid, 1 to 4 parts by volume of 30 to 60% nitric acid and 1 to 4 parts by volume of 70 to 100% acetic acid ($CH_3COOH$)
   (4) Acidic aqueous solution with a solute consisting principally of 5 to 40% hydrochloric acid (HCl)
   (5) Alkaline aqueous solution with a solute consisting principally of 10 to 50% potassium hydroxide (KOH)
   (6) Alkaline aqueous solution with a solute consisting principally of 10 to 50% sodium hydroxide (NaOH)

[2] When the metal layer 4 is formed of an aluminum-silicon alloy:
   (1) Acidic aqueous solution with a solute consisting principally of 50 to 85% phosphoric acid
   (2) Acidic aqueous solution with a solute consisting principally of 15 to 20 parts by volume of 50 to 85% phosphoric acid and 1 to 4 parts by volume of 30 to 60% nitric acid
   (3) Acidic aqueous solution with a solute consisting principally of 15 to 20 parts by volume of 50 to 85% phosphoric acid, 1 to 4 parts by volume of 30 to 60% nitric acid and 1 to 4 parts by volume of 70 to 100% acetic acid

[3] When the metal layer 4 is formed of an aluminum-copper alloy:
   (1) Acidic aqueous solution with a solute consisting principally of 50 to 85% phosphoric acid
   (2) Acidic aqueous solution with a solute consisting principally of 15 to 20 parts by volume of 50 to 85% phosphoric acid and 1 to 4 parts by volume of 30 to 60% nitric acid
   (3) Acidic aqueous solution with a solute consisting principally of 15 to 20 parts by volume of 50 to 85% phosphoric acid, 1 to 4 parts by volume of 30 to 60% nitric acid and 1 to 4 parts by volume of 70 to 100% acetic acid

[4] When the metal layer 4 is formed of copper:
   (1) Acidic aqueous solution with a solute consisting principally of 40 to 96% sulfuric acid

Figure 3A:
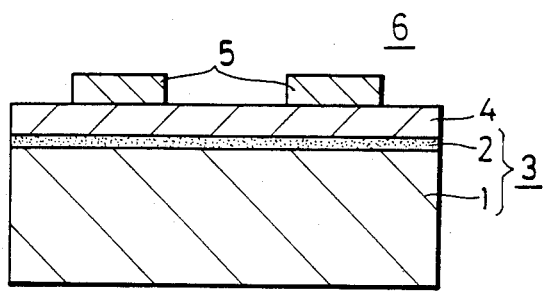
FIGS. 3A, B and C are cross-sectional views showing a series of steps involved in the patterning of the metal layer by electrolyte etching according to the present invention.
Figure 3B:
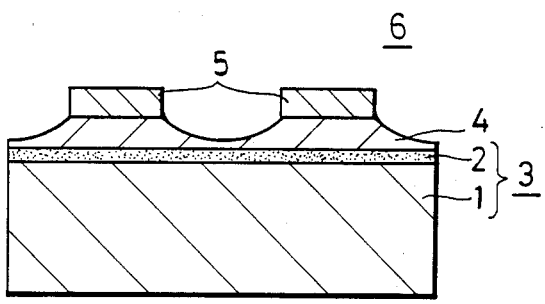
Figure 3C:
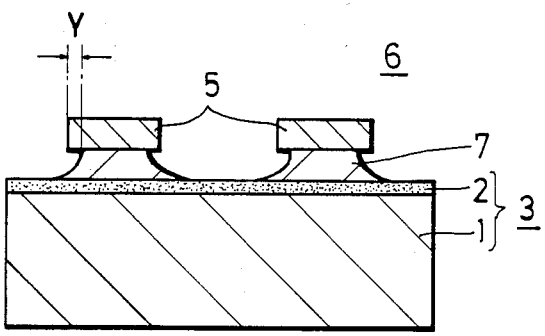

[5] When the metal layer 4 is formed of chromium:
   (1) Acidic aqueous solution with a solute consisting principally of 5 to 40% hydrochloric acid In my experiment using such electrolytes the unmasked portion of the metal layer 4 served as the anode and the electrode 13 served as the cathode, by which the unmasked portion of the metal layer 4, shown in FIG. 3A, was gradually etched from its surface as generally shown in FIG. 3B and finally etched away down to the surface of the insulating substrate 3 to form the patterned metal layer 7 underlying the mask layer 5 as shown in FIG. 3C. In this case, a platinum electrode was used as the electrode 13.

Furthermore, the present inventor conducted an experiment on the above-said method of the present invention in which a DC constant-current source was used as the DC power source 14 connected between the metal layer 4 and the electrode 13 and voltage V (in volt) between the unmasked portion of the metal layer 4 and the electrode 13 was measured by a voltmeter 15 during the electrolytic etching.

Figure 4:
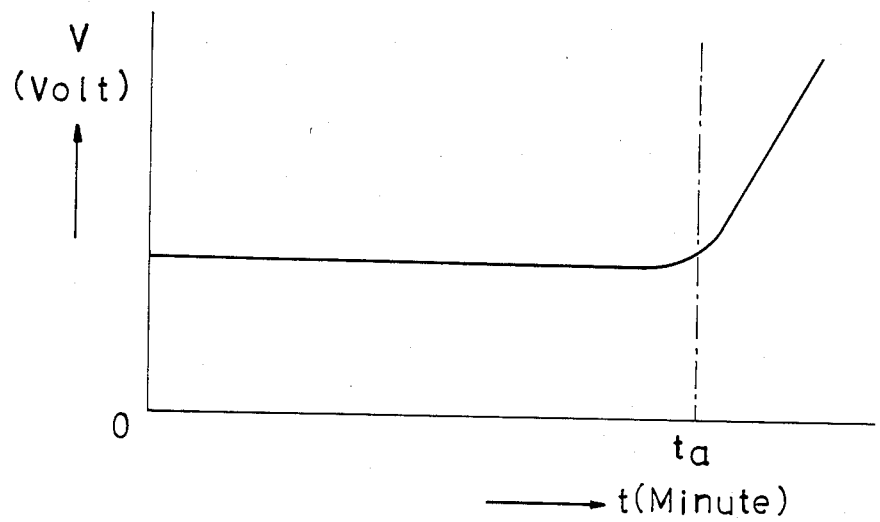
FIG. 4 is a graph showing the relation of voltage V (in volt) between the metal layer acting as an anode and the corresponding cathode to time t (in minute) in the step of patterning the metal layer by electrolyte etching through using a DC constant-current source according to the present invention.

The experimental results revealed that the relation of the voltage V(in Volt) to time t (in minute) is such as shown in FIG. 4 in which the voltage gradually rises with time t until a time point $t_a$ but thereafter increases abruptly.

Moreover, the present inventor investigated the progress of etching of the unmasked portion of the metal layer 4 in relation to the voltage V. It was found that while the voltage V gradually increases with time t until the time point $t_a$, the unmasked portion of the metal layer 4 is gradually etched away from its surface with the lapse of time and, after the time point $t_a$, the unmasked portion is etched away over its entire thickness to provide such a patterned metal layer 7 as shown generally in FIG. 3C.

Also it was found in the abovesaid case that the metal layer 4 is subjected to side etching, as shown in FIG. 3C, during the electrolytic etching which is carried out until the time point $t_a$ at which the voltage V rises abruptly, that is, when the unmasked portion of the metal layer 4 is entirely etched away.

Futhermore, the present inventor conducted an experiment on the method of the present invention in which a DC constant-voltage source was used as the DC power source 14 and current I (in mA) flowing across the metal layer 4 from the DC constant-voltage source was measured by an ammeter 16 during the electrolytic etching.

Figure 5:
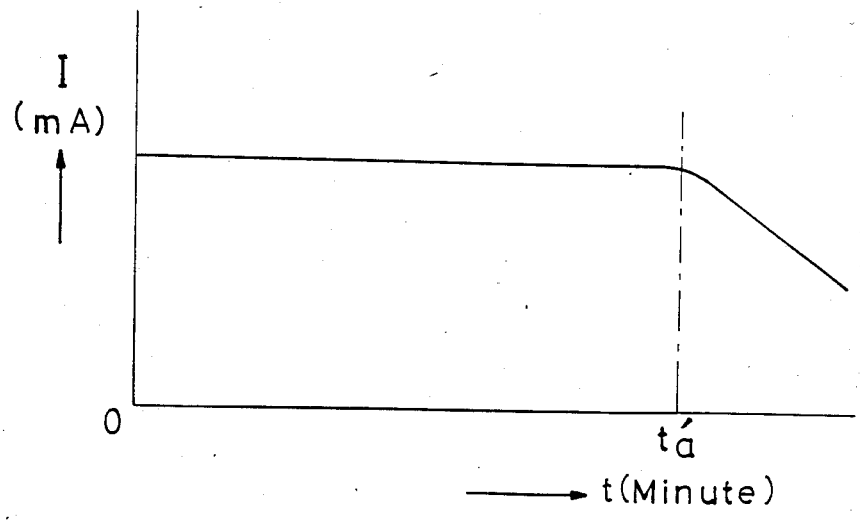
FIG. 5 is a graph showing relation between current I (in mA) flowing across the metal layer acting as the anode from a DC constant-voltage source and time t (in minute) in the step of patterning of the metal layer by electrolytic etching through using the DC constant-voltage source according to the present invention.

The experimental results revealed that the relation of the current I (in mA to time t (in minute) is such as shown in FIG. 5 in which the current I gradually decreases with time t until a time point $t_a'$ but thereafter suddenly drops.

Moreover, the present inventor investigated the progress of etching of the unmasked portion of the metal layer 4 in relation to the current I. It was found that while the current I gradually decreases with time t until the time point $t_a'$, the unmasked portion of the metal layer 4 is gradually etched away from its surface with the lapse of time and, after the time point $t_a'$, the unmasked portion is etched away over its entire thickness to provide the patterned metal layer 7 as shown in FIG. 3C.

Also it was found in the abovesaid case that the metal layer 4 is subjected to side etching, as shown in FIG. 3C, during the electrolytic etching which is carried out until the time point $t_a'$ at which the current I suddenly drops, that is, when the unmasked portion of the metal layer 4 is entirely etched away.

The present inventor conducted further experiments on the method of the present invention in which the temperature T (°C.) of the electrolyte 11 was held at a fixed value $T_e$ (°C.) and the current I flowing from the DC power source 14 via the metal layer 4 of the substrate assembly 6 and the electrode 13 to the electrolyte 11 was changed and, consequently, the density J (mA/cm$^2$) of the current flowing across the metal layer 4 was changed.

In this case, when the DC power source 14 was a DC constant-current source, the electrolytic etching was carried out until the time point $t_a$ at which the aforementioned voltage V suddenly rose; and when the DC power source 14 was a DC constant-voltage source, the electrolytic etching was carried out until the time point $t_a'$ at which the current I suddenly dropped. That is, the electrolytic etching was performed until the unmasked portion of the metal layer 4 was entirely etched away. And measurement was made of the amount of the patterned metal layer 7 side-etched, that is, the amount of side etching Y (in $\mu$m) of the layer 7.

Figure 6:
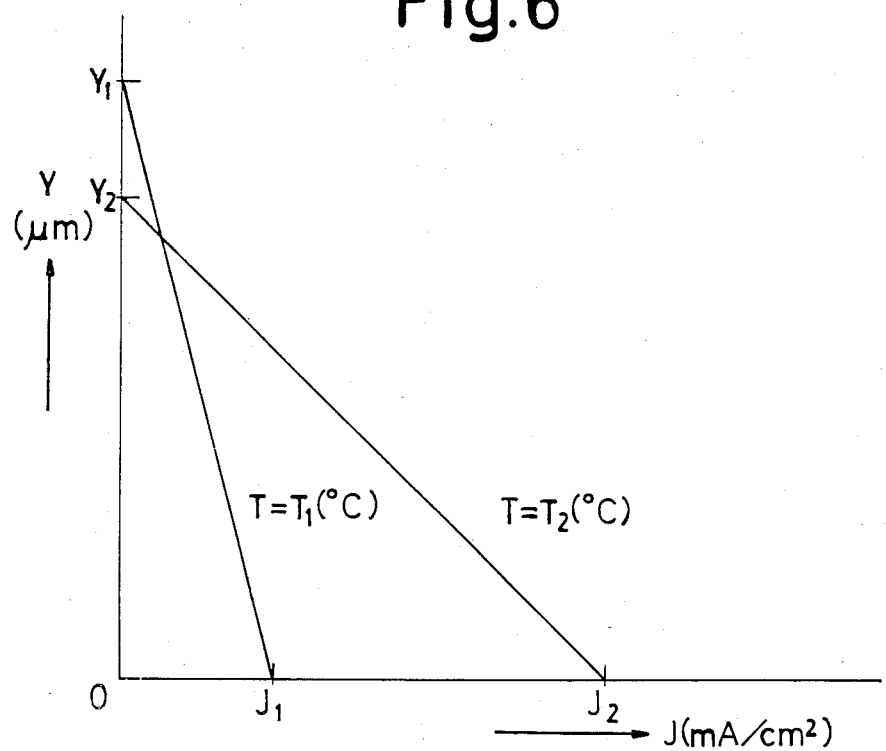
FIG. 6 is a graph showing the relation of the amount of side etching Y (in $\mu$m) of the metal layer to the current density J (in $mA/cm^2$), with the temperature of an etchant used as a parameter, in the step of patterning the metal layer by electrolytic etching according to the present invention.

As a result of this, it was found that the relation of the amount of side etching Y (in $\mu$m) to the current density J (in mA/cm$^2$) was such as shown in FIG. 6 in which the temperature T (°C.) of the electrolyte 11 is used as a parameter. In FIG. 6, values $T_1$ and $T_2$ of the temperature T bear a relation, $T_1 < T_2$, and values $Y_1$ and $Y_2$ of the amount of side etching Y bear a relation, $Y_1 > Y_2$.

The measured results shown in FIG. 6 indicate that when the temperature T of the electrolyte 11 is held at the constant value, an increase in the value of the current density J causes a decrease in the value of the amount of side etching Y.

Furthermore, it was found that the reason for which the amount of side etching Y is reduced by increasing the density J of the current flowing to the electrolyte 11 to raise the current density J is that, by increasing the current density J, the field intensity between the metal layer 4 and the electrode 13 is raised far higher mainly in the direction joining the metal layer 4 and the electrode 13 than in the other directions, resulting in the ratio between the speeds of etching of the unmasked portion in its thickwise and surface direction becoming large.

Moreover, it was found that when the current density J is held constant value, a decrease in the temperature T of the electrolyte 11 decreases the amount of side etching Y.

Also it was found that the same amount of side etching Y could be obtained by raising the temperature T of the electrolyte 11 and increasing the current density J correspondingly.

Figure 8:
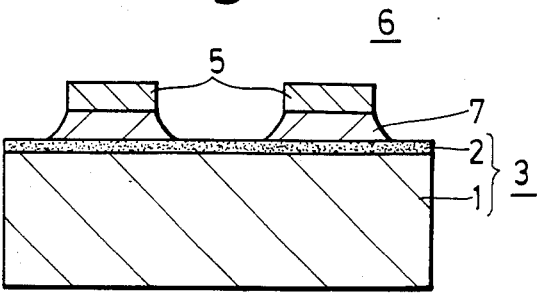
FIG. 8 is a sectional view schematically illustrating an example of the metal layer patterned by the method of the present invention.
Figure 7:
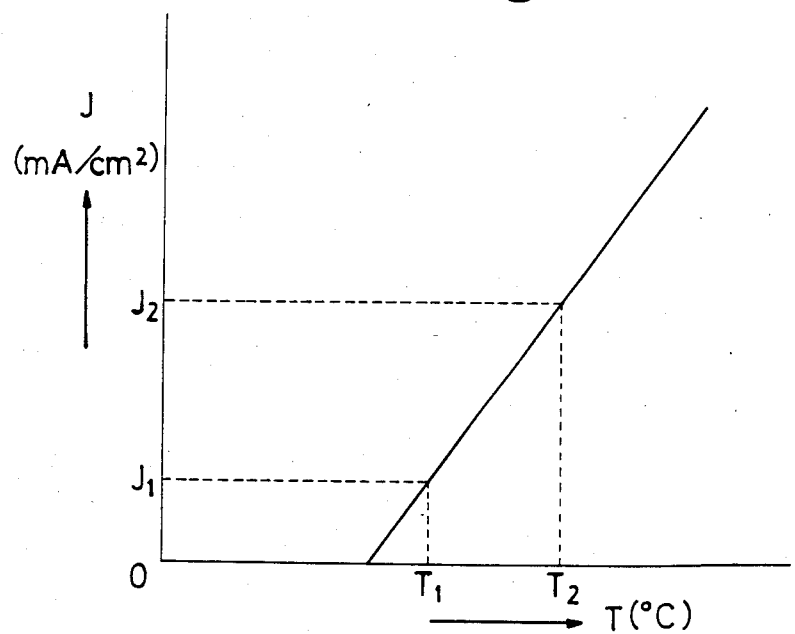
FIG. 7 is a graph showing the relation of the current density J (in $mA/cm^2$) to the electrolyte temperature T(in °C.) in the case of the amount of side etching Y (in μm) of the metal layer being reduced to zero in the step of patterning the metal layer by electrolytic etching according to the present invention.

Besides, the measured results shown in FIG. 6 revealed the following facts:

Since the current density J relative to the electrolyte temperature T, at which the amount of side etching Y is reduced to zero, assumes values $J_1$ and $J_2$ when the temperature T assumes the values $T_1$ and $T_2$, respectively, as shown in FIG. 7, and since the value of the amount of side etching Y is decreased by increasing the current density J when the electrolyte temperature T is constant value, as referred to previously, the patterned metal layer 7 can be obtained with practically no side etching, as depicted in FIG. 8, by setting the electrolyte temperature T to a constant value $T_e$ (° C.) and the current density J to a value larger than a value $J_e$ (mA/cm$^2$) given by $$T_e = a \times J_e + b \quad (1a)$$

$$a = \{(T_2 - T_1)/(J_2 - J_1)\} \times (1 \pm 0.1) \quad (1b)$$

$$b = \{(T_1 J_2 - T_2 J_1)/(J_2 - J_1)\} \times (1 \pm 0.1) \quad (1c)$$

Further, since the relation of the current density J to the electrolyte temperature T is such as shown in FIG. 7 and since a decrease in the electrolyte temperature T reduces the amount of side etching Y in the case of the current density J being held at the constant value as mentioned above, the patterned metal layer 7 can be obtained with practically no side etching as shown in FIG. 8, by setting the current density J to a value $J_e$ (mA/cm$^2$) and the electrolyte temperature T to a value smaller than a value $T_e$ given by $$T_e = a \times J_e + b \quad (2a)$$

$$a = \{(T_2 - T_1)/(J_2 - J_1)\} \times (1 \pm 0.1) \quad (2b)$$

$$b = \{(T_1 J_2 - T_2 J_1)/(J_2 - J_1)\} \times (1 \pm 0.1) \quad (2c)$$

The above is a description of the metal layer patterning method of the present invention.

With such a method of the present invention, the amount of side etching of the metal layer to be patterned by electrolytic etching through the patterned mask layer can be predicted on the basis of the electrolyte temperature T and current density J as described above in respect of FIG. 6.

Therefore, according to the method of the present invention, by forming the mask layer in anticipation of the predicted amount of side etching, the metal layer can be obtained in a predetermined pattern with excellent reproducibility, with high precision and with ease.

Furthermore, by setting the electrolyte temperature T to the value $T_e$ and the current density J to a value larger than the value $J_e$ given by the aforementioned expressions (1a) to (1c), or by setting the current density J to the value $J_e$ and the electrolyte temperature T to a value smaller than the value $T_e$ given by the expressions (2a) to (2c), the amount of side etching Y can be reduced to substantially zero.

It is therefore possible with the present invention that by forming the mask layer in the same pattern as the metal layer desired to obtain and by setting the current density J to a value larger than the abovesaid $J_e$ when the electrolyte temperature T is set to the value $T_e$, or by setting the electrolyte temperature T to a value smaller than the abovesaid $T_e$ when the current density J is set to the value $J_e$, the metal layer is obtained in the predetermined pattern with excellent reproducibility, with high precision and with ease.

Moreover, according to the present invention, when employing a DC constant-current source as the DC power source for the electrolytic etching, the time of completion of the electrolytic etching corresponds to the time point when the voltage between the metal layer serving as the anode and the cathode abruptly rises. Therefore, by carrying out the electrolytic etching until the time point when the above-said voltage suddenly increases, the metal layer of the predetermined pattern can easily be obtained with excellent reproducibility and with high precision.

In such a case, the time point of the sudden increase in the abovesaid voltage can easily be detected by known voltage detector and the electrolytic etching can readily be stopped immediately at that moment, for instance, by turning OFF the DC constant-current source connected to the metal layer and the cathode, or cutting off the line between the DC constant-current source and the metal layer or the cathode.

In the case of employing a DC constant-voltage source as the DC power source, the time point of completion of the electrolyte etching corresponds to the time point when the current flowing across the metal layer serving as the anode from the DC constant-voltage source suddenly decreases; accordingly, by carrying out the electrolytic etching until the abovesaid current suddenly decreases, the metal layer of the predetermined pattern can easily be obtained with good reproducibility and with high precision.

In the abovesaid case, too, the time point of sudden decrease in the abovementioned current can easily be detected by a known current detector and the electrolytic etching can be readily stopped immediately at that moment by a simple operation of turning OFF the DC constant-voltage source connected between the metal layer and the cathode, or cutting off the line between the DC constant-voltage source and the metal layer or the cathode.

Thus the present invention possesses such advantages as described above, which can easily be achieved with certainty.

The patterned metal layer obtained by the method of the present invention has the function of an interconnect layer or mask layer.

Accordingly, the present invention is of particular utility when employed in the formation of an interconnect layer of a semiconductor intergrated circuit or a mask layer for the fabrication of the semiconductor integrated circuit.

Next, the present invention will be described in connection with its specific examples.

EXAMPLE 1-1A

As is the case with FIG. 1A, the insulating substrate 3 having the insulating layer 2 on the substrate 1 was prepared. In this case, the substrate 1 was a silicon substrate having a surface area of 40.0 cm$^2$ and the insulating layer 2 was formed of silicon oxide (SiO$_2$)

The metal layer 4 to be patterned was formed on the insulating layer 2 of the insulating substrate 3 in the same manner as described previously in respect of FIG. 1B. In this case, the metal layer 4 was formed by vapor deposition of aluminum to a thickness of 1 $\mu$m.

Then the patterned mask layer 5 was formed on the metal layer 4 of aluminum in the same manner as described previously with regard to FIG. 1C. In this case, the mask layer 5 was made of photo resist by forming a photo resist layer on the metal layer 4, exposing the photo resist layer to light through a photo mask and then developing the photo resist layer.

In this way, the substrate assembly 6 was obtained which had the metal layer 4 of aluminum formed on the insulating substrate 3 and the patterned mask layer 5 formed on the metal layer 4 as is the case of FIG. 1C.

Next, the substrate assembly 6 was soaked into the electrolyte 11 in the cell 12, with the metal layer 4 held substantially vertically as described previously in respect of FIG. 2. In this case, the electrolyte 11 was an aqueous solution with a solute consisting principally of 85% phosphoric acid alone. In the cell 12 was placed the electrode 13 of platinum in opposing relation to the metal layer 4 of the substrate assembly 6. The unmasked portion of the metal layer 4 was connected to the positive side of the DC power source 14 which was a DC constant-current source, and the electrode 13 was connected to the negative side of the DC power source 14.

In this way, the metal layer 4 was subjected to electrolytic etching using the electrolyte 11 until the voltage V between the metal layer 4 and the electrode 13 suddenly increased, by which the patterned metal layer 7 was obtained.

In this case, since the relation of the current density J to the electrolyte temperature T in the case of the value of the amount of side etching Y of the metal layer 7 being reduced to substantially zero, shown in FIG. 7, is such that the value $J_1$ the current density J is around 1.20 mA/cm$^2$ when the value $T_1$ of the temperature T is 20.0° C. and the value $J_2$ of the current density J was about 7.42 mA/cm$^2$ when the value $T_2$ of the temperature T is 33.0° C., a in the aforementioned expressions (1b) and (2b) takes a value of 2.09(1±0.1) and b in the aforementioned expressions (1c) and (2c) takes the value of 17.5 (1±0.1). Therefore, $J_e$ in the expression (2a) is 1.20 mA/cm$^2$ when $T_e$=20.0° C. and $T_e$ is 22.0° C. when $J_e$=2.15 mA/cm$^2$.

Accordingly, the temperature of the electrolyte 11 was set to 20.0° C. and the current applied to the electrolyte 11 was set to 50.0 mA; consequently, the density of current applied to the metal layer 4 of aluminum was set to 1.25 mA/cm$^2$ (=50.0 mA/40.0 cm$^2$).

As a result of this, the patterned metal layer 7 of aluminum was obtained with practically no side etching.

EXAMPLE 1-1B

The patterned metal layer 7 of aluminum was obtained by the same steps as those employed in Example 1-1A except that the DC power source 14 was a DC constant-voltage source and the electrolytic etching was conducted until the current I flowing across the metal layer 4 from the DC constant-voltage source suddenly decreased.

Also in this case, the patterned metal layer 7 of aluminum was obtained with no appreciable side etching.

EXAMPLE 1-2A

The substrate assembly 6 was obtained which had the metal layer 4 of aluminum to be patterned on the insulating substrate 3 and the patterned mask layer 5 formed on the metal layer 4 as in the case of Example 1-1A.

Next, the patterned metal layer 7 of aluminum was obtained by the same step of electrolytic etching as in the case of Example 1-1A except that the electrolyte 11 was an aqueous solution including a solute consisting of 16 parts by volume of a 85% phosphoric acid solution and 1 part by volume of a 60% nitric acid solution.

In this case, since the relation of the current density J to the electrolyte temperature T in the case of the amount of side etching Y of the metal layer 7 being reduced to substantially zero, shown in FIG. 7, is such that the value $J_1$ of the current density J is around 1.73 mA/cm$^2$ when the value $T_1$ of the temperature T is 22.0° C. and the value $J_2$ of the current density J is about 5.96 mA/cm$^2$ when the value $T_2$ of the temperature T is 33.0° C., a in the aforementioned expressions (1b) and (2b) assumes a value of 2.6 (1±0.1) and b in the expressions (1c) and (2c) assumes a value of 17.5 (1±0.1). Therefore, $J_e$ in the expressions (1a) and (2a) is 1.73 mA/cm$^2$ when $T_e$=22.0° C., and $T_e$ is 33.0° C. when $J_e$=5.96 mA/cm$^2$.

Accordingly, the electrolyte temperature was set to 33.0° C., the current applied to the electrolyte 11 was set to 240.0 mA and the density of current applied to the metal layer 4 of aluminum was set to 6.0 mA/cm$^2$(=240.0 mA/40.0 cm$^2$).

Also in this case, the patterned metal layer 7 of aluminum was obtained with no appreciable side etching as in the case of Example 1-1A.

EXAMPLE 1-2B

The patterned metal layer 7 of aluminum was obtained by the same steps as those employed in Example 1-2A except that the DC power source 14 was a DC constant-voltage source and the electrolytic etching was carried out until the current I flowing across the metal layer 4 of aluminum from the DC constant-voltage source abruptly decreased.

In this case, too, the amount of side etching of the metal layer 7 was substantially zero.

EXAMPLE 1-3A

The substrate assembly 6 was obtained which had the metal layer 5 of aluminum formed on the insulating substrate 3 and the patterned mask layer 5 formed on the metal layer 4 in the same manner as in the case of Example 1-1A.

Next, the patterned metal layer 7 of aluminum was obtained by the same step of electrolytic etching as that employed in Example 1-1A except that the electrolyte 11 was an aqueous solution including a solute consisting of 16 parts by volume of a 85% phosphoric acid solution, 1 part by volume of a 60% nitric acid solution and 1 part by volume of a 96% acetic acid solution.

In this case, the relation of the current density J to the electrolyte temperature T in the case of the amount of side etching Y of the metal layer 7 being reduced to substantially zero, shown in FIG. 7, is such that the values $J_1$ and $J_2$ of the current density J are approximately. 1.73 and 5.96 mA/cm$^2$ when the values $T_1$ and $T_2$ of the temperature T are 22.0° and 33.0° C., respectively, a in the aforementioned expressions (1b) and (2b) has a value of 2.6 (1±0.1) and b in the expressions (1c) and (2c) has a value of 17.5 (1±0.1). Therefore, $J_e$ in the expressions (1a) and (2a) is 1.73 mA/cm$^2$ when $T_e$=22.0° C., and $T_e$ is 33.0° C. when $J_e$=5.96 mA/cm$^2$.

Accordingly, the electrolyte temperature was set to 33.0° C., the current applied to the electrolyte 11 was set to 240.0 mA and the density of current applied to the metal layer 4 of aluminum was set to 6.0 mA/cm$^2$(=240.0 mA/40.0 cm$^2$).

Also in this case, the amount of side etching Y of the patterned metal layer 7 was almost zero

EXAMPLE 1-3B

The patterned metal layer 7 of aluminum was obtained by the same steps as those employed in Example 1-3A except that the DC power source 14 was a DC constant-voltage source and the etching was continued until the current I flowing across the metal layer 4 of aluminum from the DC constant-voltage source suddenly dropped.

Also in this example, the amount of side etching Y of the patterned metal layer 7 was substantially zero.

EXAMPLE 1-4A

The substrate assembly 6 was obtained which had the metal layer of aluminum to be patterned on the insulating substrate 3 and the patterned mask layer 5 formed on the metal layer 4 as in the case of Example 1-1A.

Next, the patterned metal layer 7 of aluminum was obtained by the same steps of electrolytic etching as that employed in Example 1-1A except that the electrolyte 11 was an aqueous solution including a solute consisting of 5 to 40% hydrochloric acid (HCl).

In this case, since the relation of the current density J to the electrolyte temperature T in the case of the amount of side etching Y of the metal layer 7 being reduced to substantially zero, shown in FIG. 7, is such that the values $J_1$ and $J_2$ of the current density J are about 1.65 and 4.95 mA/cm$^2$ when the values $T_1$ and $T_2$ of the electrolyte temperature T are 22.0 and 33.0° C., respectively, a in the aforementioned expressions (1b) and (2b) assumes a value of 3.33 (1±0.1) and b in the expressions (1c) and (2c) assume 16.5 (1±0.1).

Therefore, $J_e$ in the expressions (1a) and (2a) is 1.65 mA/cm$^2$ when $T_e$=22.0° C., and $T_e$ is 33.0° C. when $J_e$=4.95 mA/cm$^2$.

Accordingly, the electrolyte temperature was set to 33.0° C., the current applied to the electrolyte 11 was set to 200.0mA and, consequently, the density of current applied to the metal layer 4 was set to 5.0 mA/cm$^2$ (=200.0mA/40.0 cm$^2$).

In this example, too, the amount of side etching of the patterned metal layer 7 was substantially zero.

EXAMPLE 1-4B

The patterned metal layer 7 of aluminum was obtained by the same steps as those employed in Example 1-4A except that the DC power source 14 was a DC constant-voltage source and the etching was carried out until the current I flowing across the metal layer 4 from the DC constant-voltage source suddenly dropped.

Also in the example, the amount of side etching of the patterned metal layer 7 was substantially zero.

EXAMPLE 1-5A

The substrate assembly 6 was obtained which had the metal layer 4 of aluminum to be patterned on the insulating substrate 3 and the patterned mask layer 5 formed on the metal layer 4 as in the case of Example 1-1A.

Next, the patterned metal layer 7 of aluminum was obtained by the same step of electrolytic etching as that employed in Example 1-1A except that the electrolyte 11 was an aqueous solution including a solute consisting of 10 to 50% potassium hydroxide (KOH).

In this case, since the relation of the current density J to the electrolyte temperature T in the case of the amount of side etching Y of the metal layer 7 being reduced to substantially zero, shown in FIG. 7, is such that the values $J_1$ and $J_2$ of the current density J are approximately 1.47 and 4.00 mA/cm$^2$ when the values $T_1$ and $T_2$ of the temperature T are 22.0° and 33.0° C., respectively, a in the afore mentioned expressions (1b) and (2b) has a value of 4.35 (1±0.1) and b in the expressions (1c) and (2c) has value 15.6 (1±0.1). Therefore, the electrolyte temperature was set to 33.0° C., the current applied to the electrolyte 11 was set to 160.0 mA and, accordingly, the density of current applied to the aluminum layer 4 was set to 4.0 mA/cm$^2$ (=160.0 mA/40.0 cm$^2$).

Also in this example, the amount of side etching of the patterned metal layer 7 was approximately zero.

EXAMPLE 1-5B

The patterned metal layer 7 of aluminum was obtained by the same steps as those employed in Example 1-5A except that the DC power source 14 was a DC constant-voltage source and the electrolytic etching was continued until the current I flowing across the metal layer 4 from the DC constant-voltage source abruptly decreased.

Also in this example, the amount of side etching of the patterned metal layer 7 of aluminum was almost zero.

EXAMPLE 1-6A

The substrate assembly 6 was obtained which had the metal layer 4 of aluminum to be patterned on the insulating substrate 3 and the patterned mask layer 5 formed on the metal layer 4 as in the case of Example 1-1A.

Next, the patterned metal layer 7 of aluminum was obtained by the same step of electrolytic etching as that employed in Example 1-1A except that the electrolyte 11 was an aqueous solution including a solute consisting of 10 to 50% sodium hydroxide (NaOH).

In this case, since the relation of the current density J to the electrolyte temperature T in the case of the amount of side etching Y of the metal layer 7 being reduced to substantially zero, shown in FIG. 7, is such that the values $J_1$ and $J_2$ of the current density J are about 1.37 and 4.45 mA/cm$^2$ when the values of the temperature T are 22.0° and 33.0° C., respectively, a in the aforementioned expressions (1b) and (2b) assumes 3.57 (1±0.1) and b in the expressions (1c) and (2c) assumes 17.1 (1±0.1). Therefore, $J_e$ in the expressions (1a) and (2a) is 1.37 mA/cm$^2$ when $T_e=22.0°$ C. and Te is 33.0° C. when $J_e=4.45$ mA/cm$^2$.

Accordingly, the electrolyte temperature 11 was set to 33.0° C., the current applied to the electrolyte 11 was set to 180.0 mA and, consequently, the density of current applied to the aluminum layer 4 was set to 4.5 mA/cm$^2$ (=180.0 mA/40.0 cm$^2$).

Also in this example, the amount of side etching of the patterned metal layer 7 was substantially zero.

EXAMPLE 1-6B

The patterned metal layer 7 of aluminum was obtained by the same steps as those in Example 1-6A except that the DC power source 14 was a DC constant-voltage source and the electrolytic etching was continued until the current I flowing across the metal layer 4 from the DC constant-voltage source decreased rapidly.

Also in this example, the amount of side etching of the patterned metal layer was substatially zero.

EXAMPLE 2-1A

The substrate assembly 6 was obtained which was the same as that in this case of Example 1-1A except that the metal layer 4 was formed of an aluminum-silicon alloy.

Next, the patterned metal layer 7 of the aluminum-silicon alloy was obtained by the same step of electrolytic etching as employed in Example 1-1A.

In this case, since the relation of the current density J to the electrolyte temperature T in the case of the amount of side etching Y of the metal layer 7 being reduced to substantially zero, shown in FIG. 7, is such that the values $J_1$ and $J_2$ of the current density J are around 1.20 and 7.42 mA/cm$^2$ when the values $T_1$ and $T_2$ of the temperature T are 20.0° and 23.0° C., respectively, a in the aforementioned expressions (1b) and (2b) has avalue of 2.09 (1±0.1) and b in the expressions (1c) and (2c) has a value of 17.5 (1±0.1). Therefore, $J_e$ in the expressions (1a) and (2a) is 1.20 mA/cm$^2$ when $T_e=20.0°$ C. and $T_e$ is 33.0° C. when $J_e=7.42$ mA/cm$^2$.

Accordingly, the electrolyte temperature was set to 33.0° C., the current applied to the electrolyte 11 was set to 50.0 mA and, consquently, the density of current applied to the metal layer 4 of the aluminum-silicon alloy was set to 1.25mA/cm$^2$ (=50.0 mA/40.0 cm$^2$).

Also in this example, the amount of side etching of the patterned metal layer 7 of aluminum-silicon alloy was approximately zero.

EXAMPLE 2-1B

The patrerned metal layer 7 of aluminum-silicon alloy was obtained by the same steps as used in Example 2-1A except that the DC power source 14 was a DC constant-voltage source and the electrolytic etching was continued until the current I flowing across the metal layer 4 from the DC constant-voltage source suddenly decreased.

Also in this example, the amount of side etching of the patterned metal layer 7 of aluminum-silicon alloy was substantially zero.

EXAMPLE 2-2A

The substrate assembly 6 was obtained which had the metal layer 4 of aluminum-silicon alloy to be patterned on the insulating substrate 3 and the patterned mask layer 5 formed on the metal layer 4 as in the case of Example 2-1A.

Next, the patterned metal layer 7 of aluminum-silicon alloy was obtained by the same step of electrolyte etching as employed in Example 2-1A except that the electrolyte 11 was an aqueous solution including a solute consisting of 16 parts by volume of a 85% phosphoric acid solution and 1 part by volume of a 60% nitric acid solution.

In this case, since the relation of the current density J to the electrolyte temperature T in the case of the amount of side etching of the metal layer 7 being reduced to substantially zero, shown in FIG. 7, is such that the values $J_1$ and $J_2$ of the current density J are about 1.20 mA/cm$^2$ and about 7.42 mA/cm$^2$ when the values $T_1$ and $T_2$ of the temperature T are 20.0° and 33.0° C., respectively, a in the aforementioned expressions (1b) and (2b) takes a value of 2.09 (1±0.1) and b in the expressions (1c) and (2c) takes a value of 17.5 (1±0.1). Therefore, $J_e$ in the expressions (1a) and (2a) is 1.20 mA/cm$^2$ when $T_e$=20.0° C. and $T_e$ is 33.0° C. when $J_e$=7.42 mA/cm$^2$.

Accordingly, the electrolyte temperature was set to 20.0° C., the current applied to the electrolyte 11 was 50.0 mA and the density of current applied to the metal layer 4 of aluminum-silicon alloy was set to 1.25 mA/cm$^2$.

Also in this example, the amount of side etching of the patterned metal layer 7 of aluminum-silicon alloy was substantially zero.

EXAMPLE 2-2B

The patterned metal layer 7 of aluminum-silicon alloy was obtained by the same steps as those used in Example 2-2A except that the DC power source 14 was a DC constant-voltage source and the electrolytic etching was continued until the current I flowing across the metal layer 4 from the DC constant-voltage source suddenly decreased.

Also in the example, the amount of side etching of the patterned metal layer of aluminum-silicon alloy was almost zero.

EXAMPLE 2-3A

The substrate assembly 6 was obtained which had the metal layer 4 aluminum-silicon alloy to be patterned on the insulating substrate 3 and the patterned mask layer 5 formed on the metal layer 4 as in the case of Example 2-1A.

Next, the patterned metal layer 7 of aluminum-silcon alloy was obtained by the same step of electrolytic etching as employed in Example 2-1A except that the electrolyte 11 was an aqueous solution including a solute consisting of 16 parts by volume of a 85% phosphoric acid solution, 1 part by volume of a 60% nitric acid solution and 1 part by volume of a 96% acetic acid solution.

In this case, since, the relation of the current density J to the electrolyte temperature T in the case of the amount of side etching Y of the metal layer 7 being reduced to substantially zero, shown in FIG. 7, is such that the values $J_1$ and $J_2$ of the current density J are approximately 1.20 mA/cm$^2$ and approximately 7.42 mA/cm$^2$ when the values $T_1$ and $T_2$ of the temperature T are 20.0 and 33.0° C., respectively, a in the aforementioned expressions (1b) and (2b) assumes a value of 2.09 (1±0.1) and b in the expressions (1c) and (2c) assumes a value of 17.5 (1±0.1). Therefore, $J_e$ in the expressions (1a) and (2a) is 1.20 mA/cm$^2$ when $T_e$=20.0° C. and $T_e$ is 33.0° C. when $J_e$=7.42 mA/cm$^2$.

Accordingly, the electrolyte temperature was set to 20.0° C., the current applied to the electrolyte 11 was set to 50.0 mA and the density of current applied to the metal layer 4 of aluminum-silicon alloy was set to 1.25 mA/cm$^2$(=50.0 mA/cm$^2$).

Also in this example, the amount of side etching of the patterned metal layer 7 of aluminum-silicon alloy was substantially zero.

EXAMPLE 2-3B

The patterned metal layer 7 of aluminum-silicon alloy was obtained by the same steps as those employed in Example 2-3A except that the DC power source 14 was a DC constant-voltage source and the electrolytic etching was continued until the current flowing across the metal layer 4 from the DC constant-voltage source suddenly decreased.

In this example, too, the amount of side etching of the patterned metal layer 7 of aluminum-silicon alloy was almost zero.

EXAMPLE 3-1A

The substrate assembly 6 was obtained which was the same as that in Example 1-1A except that the metal layer 4 was formed of an aluminum-copper alloy.

Next, the patterned metal layer 7 of aluminum-copper alloy was obtained by the same step of electrolytic etching as that employed in Example 1-1A.

In this case, since the relation of the current density J to the electrolyte temperature T in the case of the amount of side etching Y of the metal layer 7 being reduced to substantially zero, shown in FIG. 7, is such that the values $J_1$ and $J_2$ of the current density J are about 1.46 mA/cm$^2$ and about 6.04 mA/cm$^2$ when the values $T_1$ and $T_2$ of the temperature T are 22.0° and 33.0° C., respectively, a in the aforementioned expressions (1b) and (2b) assumes a value of 2.40 (1±0.1) and b in the expression (1c) and (2c) assumes a value of 18.5 (1±0.1). Therefore, $J_e$ in the expressions (1a) and (2a) is 1.40 mA/cm$^2$ when $T_e$=22.0 ° C. and $T_e$ is 33.0° C. when $J_e$=6.04 mA/cm$^2$.

Accordingly, the electrolyte temperature was set to 33.0° C., the current applied to the electrolyte 11 was set to 244.0 mA and, consquentaly, the density of current applied to the aluminum-copper alloy layer 4 was set to 6.10 mA/cm$^2$(=244.0 mA/40.0cm$^2$).

Also in this example, the amount of side etching of the patterned metal layer 7 of aluminum-copper alloy was almost zero.

EXAMPLE 3-1B

The metal layer 7 of aluminum-copper alloy was obtained by the same steps as those employed in Example 3-1A except that the DC power source 14 was a DC constant-voltage source and the electrolytic etching was carried out until the current I flowing across the metal layer 4 from the DC constant-voltage source suddenly decreased.

Also in this example, the amount of side etching of the patterned metal layer 7 of aluminum-copper alloy was substantially zero.

EXAMPLE 3-2A

The substrate assembly 6 was obtained which had the metal layer 4 of aluminum-copper alloy to be patterned on the insulating substrate 3 and the patterned mask layer 5 formed on the metal layer 4 as in the case of Example 3-1A.

Next, the patterned metal layer 7 of aluminum-copper alloy was obtained by the same step of electrolytic etching as that employed in Example 3-1A except that the electrolyte 11 was an aqueous solution including a solute consisting of 16 parts by volume of a 85% phosphoric acid solution and 1 part by volume of a 60% nitric acid solution In this case, since the relation of the current density J to the electrolyte temperature T in the case of the amount of side etching Y of the mental layer 7 being reduced to substantially zero, shown in FIG. 7, is such that the values $J_1$ and $J_2$ of the current density J are around 1.46 mA/cm$^2$ and around 6.04 mA/cm$^2$ when the values $T_1$ and $T_2$ of the temperature T are 22.0° and 33.0° C., respectively, a in the aforementioned expressions (1b) and (2b) assumes a value of 2.40 (1±0.1) and b in the expressions (1a) and (2a) assumes a value of 18.5 (1±0.1). Therefore, $J_e$ in the expressions (1a) and (2a) is 1.46 mA/cm$^2$ when $T_e$=22.0° C. and $T_e$ is 33.0° C. when $J_e$=6.04 mA/cm$^2$.

Accordingly, the electrolyte temperature was set to 33.0° C., the current applied to the electrolyte 11 was set to 244.0 mA and the density of current applied to the metal layer 4 of aluminum-copper alloy was set to 6.10 mA/cm$^2$(=244.0 mA/40.0 cm$^2$).

Also in this example, the amount of side etching of the patterned metal layer 7 of aluminum-copper alloy was substantially zero.

EXAMPLE 3-2B

The patterned metal layer 7 of aluminum-copper alloy was obtained by the same steps as those employed in Example 3-2A except that the DC power source 14 was a DC constant-voltage source and the electrolytic etching was continued until the current I forming across the metal layer from the DC constant-voltage source suddenly decreased.

Also in this example, the amount of side etching of the patterned metal layer 7 of aluminum-copper alloy was substantially zero.

EXAMPLE 3-3A

The substrate assembly 6 was obtained which had the metal layer of aluminum-copper alloy to be patterned on the insulating substrate 3 and the patterned mask layer 5 formed on the metal layer 4 as in the case of Example 3-1A Next, the patterned metal layer 7 of aluminum-copper alloy was obtained by the same step of electrolytic etching as that employed in Example 3-1A except that the electrolyte 11 was an aqueous solution including a solute consisting of 16 parts by volume of 85% phoshoric acid solution, 1 part by volume of a 60% nitric acid solution and 1 part by volume of 96% acetic acid solution.

In this case, since the relation of the current density J to the electrolyte temperature T in the case of the amount of side etching Y of the metal layer 7, shown in FIG. 7, is such that the values $J_1$ and $J_2$ of the current sensity J are about 1.46 mA/cm$^2$ and about 6.04 mA/cm$^2$ when the values $T_1$ and $T_2$ of the temperature T are 22.0° and 33.0° C., respectively, a in the aforementioned expressions (1b) and (2b) takes a value of 2.40 (1±0.1) and b in the expressions (1c) and (2c) takes a value of 18.5 (1±0.1). Therefore, $J_e$ in the expressions (1a) and (2a) is 1.40 mA/cm$^2$ when $T_e$=22.0° C. and $T_e$ is 33.0° C. when $J_e$=6.04 mA/cm$^2$.

Accordingly, the electrolyte temperature was set to 33.0° C., the current applied to the electrolyte 11 was set to 244.0 mA and the density of current applied to the metal layer 4 of aluminum-copper alloy was set to 6.10 mA/cm$^2$(=244.0 mA/40.0 cm$^2$).

Also in this example, the amount of side etching of the patterned metal layer 7 of aluminum-copper alloy was substantially zero.

EXAMPLE 3-3B

The patterned metal layer 7 of aluminum-copper alloy was obtained by the same steps as those emplyed in Example 3-3A except that the DC power source 14 was a DC constant-voltage source and the electrolytic etching was continued until the current I flowing across the metal layer 4 from the DC constant-voltage source suddenly decreased.

Also in this example, the amount of side etching of the patterned metal layer of aluminum-copper alloy was substantially zero.

EXAMPLE 4A

The substrate assembly 6 was obtained in which the metal layer of copper to be patterned was formed on the insulating substrate 3 and the patterned mask layer 5 was formed on the metal layer 4 as in the case of Example 1-1A.

Next, the patterned metal layer 7 of copper was obtained by the same step of electrolytic etching as that employed in Example 1-1A except that the electrolyte 11 was an aqueous solution including a solute consisting of 5 to 40% sulfuric acid.

In this case, since the relation of the current density J to the electrolyte temperature T in the case of the amount of side etching Y of the metal layer 7 being reduced to substantially zero, shown in FIG. 7, is such that the values $J_1$ and $J_2$ of the current density J are about 1.19 mA/cm$^2$ and about 3.98 mA/cm$^2$ when the value $T_1$ and $T_2$ of the temperature T are 22.0° and 33.0° C., respectively, a in the aforementioned expressions (1b) and (2b) takes a value of 3.94 (1±0.1) and b in the expressions (1b) and (2b) takes a value of 17.3 (1±0.1). Therefore, $J_e$ in the expressions (1a) and (2a) is 1.19 mA/cm$^2$ when $T_e$=22.0 ° C. and $T_e$ is 33.0° C. when $J_e$=3.98 mA/cm$^2$.

Accordingly, the electrolyte temperature was set to 33.0° C., the current applied to the electrolyte 11 was set to 160.0 mA and, consquently, the density of current applied to the metal layer 4 of copper was set to 4.0 mA/cm$^2$(=160.0 mA/40.0 cm$^2$).

Also in this example, the amount of side etching of the patterned metal layer 7 of copper was almost zero.

EXAMPLE 4B

The patterned metal layer 7 of copper was obtained by the same steps as those employed in Example 4A except that the DC power source 14 was a DC constant-voltage source and the electrolytic etching was continued until the current I flowing across the metal layer 4 from the DC constant-voltage source suddenly decreased.

Also in this example, the amount of side etching of the patterned metal layer 7 of copper was almost zero.

EXAMPLE 5A

The substrate assembly 6 was obtained in which the metal layer 4 of chromium to be patterned was formed on the insulating substrate 3 and the patterned mask layer was formed on the metal layer 4 as in the case of Example 1-1A.

Next, the patterned metal layer 7 of chromium was obtained by the same step of electrolytic etching as that employed in Example 1-1A except that the electrolyte 11 was an aqueous solution including a solute consisting of 5 to 40% hydrochloric acid.

In this case, since the relation of the current density J to the electrolyte temperature T in the case of the amount of side etching Y of the metal layer 7 being reduced to substantially zero, shown in FIG. 7, is such that the values $J_1$ and $J_2$ of the current density J are approximately 2.33 mA/cm$^2$ and approximately 6.00 mA/cm$^2$ when the values $T_1$ and $T_2$ of the temperature T are 22.0° and 33.0° C., respectively, a in the aforementioned expressions (1b) and (2b) takes a value of 3.00 (1±0.1) and b in the expressions (1c) and (2c) takes a value of 15.0 (1±0.1). Therefore, $J_e$ in the expressions (1a) and (2a) is 2.33 mA/cm$^2$ when $T_e$=22.0° C. and $T_e$ is 33.0° C. when $J_e$=6.00 mA/cm$^2$.

Accordingly, the electrolyte temperature was set to 33.0° C., the current applied to the electrolyte 11 was set to 240.0 mA and, consquently, the density of current applied to the metal layer 4 of chromium was set to 6.00 mA/cm$^2$(=240.0 mA/40.0 cm$^2$).

Also in this example, the amount of side etching of the patterned metal layer 7 of chromium was substrantially zero.

EXAMPLE 5B

The patterned metal layer 7 of chromium was obtained by the same steps as those employed in Example 5A except that the DC power source 14 was the DC constant-voltage source and the electrolytic etching was continued until the current I flowing across the metal layer 4 from the DC constant-voltage source suddenly decreased.

Also in this example, the amount of side etching of the patterned metal layer 7 of chromium was substantially zero.

It will be apparent that many modifications and variations may be effected without departing from the scope of the novel concepts of the present invention.

What is claimed is:

1. A metal layer patterning method comprising the steps of:
    forming a metal layer to be patterned on an insulating substrate;
    forming a mask layer of a desired pattern on the metal layer; and
    subjecting the metal layer to electrolytic etching by an electrolyte through the mask layer to form a patterned metal layer;
    wherein the metal layer to be patterned is formed of an aluminum-silicon alloy;
    wherein the electrolyte is a basic aqueous solution including a solute consisting principally of phosphoric acid;
    wherein a DC constant-current source is connected between the metal layer and an electrode corresponding thereto;
    wherein the temperature of the electrolyte is set to a constant value Te(°C.) and the density of current flowing across the metal layer to the electrolyte is set to a constant value larger than a value Je(-mA/cm$^2$) given by $Te=a \times Je+b$ a=2.09 (1±0.1)
    b=17.5 (1±0.1) ; and wherein the electrolytic etching is carried out until voltage between the metal layer and the electrode increases suddenly.

2. A metal layer patterning method comprising the steps of:
    forming a metal layer to be patterned on an insulating substrate;
    forming a mask layer of a desired pattern on the metal layer; and
    subjecting the metal layer to electrolytic etching by an electrolyte through the mask layer to form a patterned metal layer;
    wherein the metal layer to be patterned is formed of an aluminum-silicon alloy;
    wherein the electrolyte is a basic aqueous solution including a solute consisting principally of phosphoric acid;
    wherein a DC constant-current source is connected between the metal layer and an electrode corresponding thereto;
    wherein the density of current flowing across the metal layer to the electrolyte is set to a constant value Je (mA/cm$^2$) and the temperature of the electrolyte is set to a constant value smaller than a value Te (°C.) given by $Te=a \times Je+b$ a=2.09 (1±0.1)
    b=17.5 (1±0.1); and wherein the electrolytic etching is carried out until voltage between the metal layer and the electrode increases suddenly.

3. A metal layer patterning method comprising the steps of:
    forming a metal layer to be patterned on an insulating substrate;
    forming a mask layer of a desired pattern on the metal layer; and
    subjecting the metal layer to electrolytic etching by an electrolyte through the mask layer to form a patterned metal layer;
    wherein the metal layer to be patterned is formed of an aluminum-silicon alloy;
    wherein the eletrolyte is a basic aqueous solution including a solute consisting principally of phosphoric acid and nitric acid;
    wherein a DC constant-current source is connected between the metal layer and an electrode corresponding thereto;
    wherein the temperature of the electrolyte is set to a constant value Te (°C.) and the density of current flowing across the matal layer to the electrolyte is set to a constant value larger than a value Je(-mA/cm$^2$) given by $Te=a \times Je+b$ a=2.09 (1±0.1)
    b=17.5 (1±0.1); and wherein the electrolytic etching is carried out until voltage between the metal layer and the electrode increases suddenly.

4. A metal layer patterning method comprising the steps of:
    forming a metal layer to be patterned on an insulating substrate;

forming a mask layer of a desired pattern on the metal layer; and subjecting the metal layer to electrolytic etching by an electrolyte through the mask layer to from a patterned metal layer;

wherein the metal layer to be patterned is formed of an aluminum-silicon alloy;

wherein the electrolyte is a basic aqueous solution including a solution consisting principally of phosphoric acid and nitric acid;

wherein a DC constant-current source is connected between the metal layer and an electrode corresponding thereto;

wherein the density of current flowing across the metal layer to the elctrolyte is set to a constant value Je (mA/cm$^2$) and the temperature of the electrolyte is set to a constant value smaller than a value Te (°C.) given by $$Te = a \times Je + b$$

a = 2.09 (1±0.1)
b = 17.5 (1±0.1); and wherein the electrolytic etching is carried out util voltage between the metal layer and the electrode increasses suddenly.

5. A metal layer patterning method comprising the steps of:

forming a metal layer to be patterned on an insulating substrate;

forming a mask layer of a desired pattern on the metal layer; and aubjecting the metal layer to electrolytic etching by an electrolyte through the mask layer to form a patterned metal layer;

wherein the metal layer to be patterned is formed of an aluminum-silicon alloy;

wherein the electrolyte is a basic aqueous solution including a slolute consisting principally of phosphoric acid, nitric acid and acetic acid;

wherein a DC constant-current source is connected between the metal layer and an electrode corresponding thereto;

wherein the temperature of the electrolyte is set to a constant value Te (°C.) and the density of current flowing across the metal layer to the electrolyte is set to constant value larger than a value Je(-mA/cm$^2$) given by $$Te = a \times Je + b$$

a = 2.09 (1±0.1)
b = 17.5 (1±0.1); and wherein the electrolytic etching is carried out until voltage between the metal layer and the electrode increasses suddenly.

6. A metal layer patterning method comprising the steps of:

forming a metal layer to be patterned on an insulating substrate;

forming a mask layer of a desired pattern on the metal layer; and subjecting the metal layer to electrolytic etching by an electrolyte through the mask layer to form a patterned metal layer;

wherein the metal layer to be patterned is formed of an aluminum-silicon alloy;

wherein the electrolyte is a basic aqueous solution including a slolute consisting principally of phosphoric acid, nitric acid and acetic acid;

wherein a DC constant-current source is connected between the metal layer and an electrode corresponding thereto;

wherein the density of current flowing across the metal layer to the electrolyte is set to a constant value Je (mA/cm$^2$) and the temperature of the electrolyte is set to a constant value smaller than a value Te (°C.) given by $$Te = a \times Je + b$$

a = 2.09 (1±0.1)
b = 17.5 (1±0.1); and wherein the electrolytic etching is carried out until voltage between the metal layer and the electrode increasses suddenly.

7. A metal layer patterning method comprising the steps of:

forming a metal layer to be patterned on an insulating substrate;

forming a mask layer of a desired pattern on the metal layer; and subjecting the metal layer to electrolytic etching by an electrolyte through the mask layer to form a patterned metal layer;

wherein the metal layer to be patterned is formed of an aluminum-copper alloy;

wherein the electrolyte is a basic aqueous solution including a solute consisting principally of phosphoric acid;

wherein a DC constant-current source is connected between the metal layer and an electrode corresponding thereto;

wherein the temperature of the electrolyte is set to a constant value Te (°C.) and the density of current flowing across the metal layer to the electrolyte is set to a constant value larger than a value Je (mA/cm$^2$) given by $$Te = a \times Je + b$$

a = 2.40 (1±0.1)
b = 18.5 (1±0.1); and wherein the electrolytic etching is carried out until voltage between the metal layer and the electrode increasses suddenly.

8. A metal layer patterning method comprising the steps of:

forming a metal layer to be patterned on an insulating substrate;

forming a mask layer of a desired pattern on the metal layer; and subjecting the metal layer to electrolytic etching by an electrolyte through the mask layer to form a patterned metal layer;

wherein the metal layer to be patterned is formed of an aluminum-copper alloy;

wherein the electrolyte is a basic aqueous solution including a solute consisting principally of phosphoric acid;

wherein a DC constant-current source is connected between the metal layer and an electrode corresponding thereto;

wherein the density of current flowing across the metal layer to the electrolyte is set to a constant value Je (mA/cm²) and the temperature of the electrolyte is set to a constant value smaller than a value Te (°C.) given by $$Te = a \times Je + b$$

a=2.40 (1±0.1)
b=18.5 (1±0.1); and
wherein the electrolytic etching is carried out until voltage between the metal layer and the electtrode increases suddenly.

9. A metal layer patterning method comprising the steps of:
forming a metal layer to be patterned on an insulating substrate;
forming a mask layer of a desired pattern on the metal layer; and
subjecting the metal layer to electrolytic etching by an electrolyte through the mask layer to form a patterned metal layer;
wherein the metal layer to be patterned is formed of an aluminum-copper alloy;
wherein the electrolyte is a basic aqueous solution including absolute consisting principally of phosphoric acid and nitric acid;
wherein a DC constant-current source is connected between the metal layer and an electrode corresponding thereto;
wherein the temperature of the electrolyte is set to a constant value Te (°C.) and the density of current flowing across the metal layer to the electrolyte is set to a constant value larger than a value Je (mA/cm²) given by $$Te = a \times je + b$$

a=2.40 (1±0.1)
b=18.5 (1±0.1); and
wherein the electrolytic etching is carried out until voltage between the metal layer and the electrode increases suddenly.

10. A metal layer patterning method comprising the steps of:
forming a metal layer to be patterned on an insulating substrate;
forming a mask layer of a desired pattern on the metal layer; and
subjecting the metal layer to electrolytic etching by an electrolyte through the mask layer to form a patterned metal layer;
wherein the metal layer to be patterned is formed of an aluminum-copper alloy;
wherein the electrolyte is a basic aqueous solution including a solute consisting principally of phosphoric acid and netric acid;
wherein a DC constant-current source is connected between the metal layer and an electrode corresponding thereto;
wherein the density of current flowing across the metal layer to the electrolyte is set to a constant value Je (mA/cm²) and the temperature of the electrolyte is set to a constant value samller than a value Te (°C.) given by $$Te = a \times Je + b$$

a=2.40 (1±0.1)
b=18.5 (1±0.1); and
wherein the electrolytic etching is carried out until voltage between the metal layer and the electrode increases suddenly.

11. A metal layer patterning method comprising the steps of:
forming a metal layer to be patterned on an insulating substrate;
forming a mask layer of a desired pattern on the metal layer; and
subjecting the metal layer to electrolytic etching by an electrolyte through the mask layer to form a patterned metal layer;
wherein the metal layer to be patterned is formed of an aluminum-copper alloy;
wherein the electrolyte is a basic aqueous solution including a solute consisting principaly of phosphoric acid, nitric acid and acetic acid;
wherein a DC constant-current source is connected between the metal layer and an electrode corresponding thereto;
wherein the temperature of the electrolyte is set to a constant value Te (°C.) and the density of current flowing across the metal layer to the electrolyte is set to a constant value larger than a value Je(-mA/cm²) given by $$Te = a \times Je + b$$

a=2.40 (1±0.1)
b=18.5 (1±0.1); and
wherein the electrolytic etching is carried out until voltage between the metal layer and the electrode increases suddenly.

12. A metal layer paterning method comprising the steps of:
forming a metal layer to be patterned on an insulating substrate;
forming a mask layer of a desired pattern on the metal layer; and
subjecting the metal layer to electrolytic etching by an electrolyte through the mask layer to form a patterned metal layer;
wherein the metal layer to be patterned is formed of an aluminum-copper alloy;
wherein the electrolyte is a basic aqueous solution including a solute consisting principally of phosphoric adid, nitric acid and acetic acid;
wherein a DC constant-current source is connected between the metal layer and an electrode corresponding thereto;
wherein the density of current flowing across the metal layer to the electrolyte is set to a constant value Je (mA/cm²) and the temperature of the electrolyte is set to a constant value smaller than a value Te(°C.) given by $$Te = a \times je + b$$

a=2.40 (1±0.1)
b=18.5 (1±0.1); and
wherein the electrolytic etching is carried out until voltage between the metal layer and the electrode increases suddenly.

13. A metal layer patterning method comprising the steps of:
forming a metal layer to be patterned on an insulating substrate;

forming a mask layer of a desired pattern on the metal layer; and subjecting the metal layer to electrolytic etching by an electrolyte through the mask layer to form a patterned metal layer;

wherein the metal layer to be patterned is formed of copper;

wherein the electrolyte is a basic aqueous solution including a solute consisting principally of sulfuric acid;

wherein a DC constant-current source is connected between the metal layer and an electrode corresponding thereto;

wherein the temperature of the electrolyte is set to a constant value Te (°C.) and the density of current flowing across the metal layer to a electrolyte is set to a constant value larger than a value Je (mA/cm$^2$) determined by the constant value Te (°C.) of the electrolyte temperature;

wherein, letting $J_1$ (mA/cm$^2$) and $J_2$ (mA/cm$^2$) represent values of the densities of current flowing across the metal layer to the electrolyte in the case of the amount of side etching of the patterned metal layer being substantially zero when the electrolytic etching is carried out with the electrolyte terperature held at $T_1$ (°C.) and $T_2$ (°C.), the value Je of the current density is given by $Te = a \times Je + b$ $a = [(T_2 - T_1)/(J_2 - J_1)] \times (1 \pm 0.1)$ $b = [(T_1 J_2 - T_2 J_1)/(J_2 - J_1)] \times (1 \pm 0.1);$ and wherein the electrolytic etching is carried out until voltage between the metal layer and the electrode increases suddenly.

14. A metal layer patterning method comprising the steps of:

forming a metal layer to be patterned on an insulating substrate;

forming a mask layer of a desired pattern on the metal layer; and subjecting the metal layer to electrolytic etching by an electrolyte through the mask layer to form a patterned metal layer;

wherein the metal layer to be patterned is formed of copper;

wherein the electrolyte is a basic aqueous solution including a solute consisting principally of sulfuric acid;

wherein a DC constant-current source is connected between the metal layer and an electrode corresponding thereto;

wherein the temperature of the electrolyte is set to a constant value Te (°C.) and the density of current flowing across the metal layer to the electrolyte is set to a constant value larger than a value Je (mA/cm$^2$) determined by the constant value Te (°C.) of the electrolyte temperature;

wherein, letting $J_1$ (mA/cm$^2$) and $J_2$ (mA/cm$^2$) represent values of the densities of current flowing across the metal layer to the electrolyte in the case of the amount of side etching of the patterned metal layer being substantially zero when the electrolytic etching is carried out with the electrolyte temperature held at $T_1$ (°C.) and $T_2$ (°C.), the value Je of the current density is given by $Te = a \times Je + b$ $a = [(T_2 - T_1)/(J_2 - J_1)] \times (1 \pm 0.1)$ $b = [(T_1 J_2 - T_2 J_1)/(J_2 - J_1)] \times (1 \pm 0.1);$ and wherein the electrolytic ethching is carried out until voltage between the metal layer and the electrode increases suddenly.

15. A metal layer patterning method according to claim 14, wherein the a and b are given by a = 3.94 (1 ± 0.1)

b = 17.3 (1 ± 0.1)

16. A metal layer patterning method comprising the steps of:

forming a metal layer to be patterned on an insulating substrate;

forming a mask layer of a desired pattern on the metal layer; and subjecting the metal layer to electrolytic etching by an electrolyte through the mask layer to form a patterned metal layer;

wherein the metal layer to be patterned is formed of chromium;

wherein the electrolyte is a basic aqueous solution including a solute consisting principally of hydrochloric acid;

wherein a DC constant-current source is connected between the metal layer and an electrode corresponding thereto;

wherein the temperature of the electrolyte is set to a constant value Te (°C.) and the density of current flowing across the metal layer to the electrolyte is set to a constant value larger than a value Je (mA/cm$^2$) determined by the constant value Te (°C.) of the electrolyte temperature;

wherein, letting $J_1$ (mA/cm$^2$) and $J_2$ (mA/cm$^2$) represent values of the densities of current flowing across the metal layer to the electrolyte in the case of the amount of side etching of the patterned metal layer being substantially zero when the electrolytic etching is carried out with the electrolyte temperature held at $T_1$ (°C.) and $T_2$ (°C.), the value Je of the current density is given by $Te = a \times Je + b$ $a = [(T_2 - T_1)/(J_2 - J_1)] \times (1 \pm 0.1)$ $b = [(T_1 J_2 - T_2 J_1)/(J_2 - J_1)] \times (1 \pm 0.1);$ and wherein the electrolytic etching is carried out until voltage between the metal layer and the electrode increases suddednly.

17. A metal layer aptterning method comprising the steps of:

forming a metal layer to be patterned on an insulating substrate;

forming a mask layer of a desired pattern on the metal layer; and subjecting the metal layer to electrolytic etching by an electrolyte through the mask layer to form a patterned metal layer;

wherein the metal layer to be patterned is formed of chromium;

wherein the electrolyte is a basic aqueous solution including a solute consisting principally of hydrocholoric acid;

wherein a DC constant-current source is connected between the metal layer and an electrode corresponding thereto;

wherein the temperature of the electrolyte is set to a constant value Te (°C.) and the density of current flowing across the metal layer to the electrolyte is set to a constant value larger than a value Je (mA/cm$^2$) determined by the constant value Te (°C.) of the electrolyte temperature;

wherein, letting $J_1$ (mA/cm$^2$) and $J_2$ (mA/cm$^2$) represent values of the densities of current flowing across the metal layer to the electrolyte in the case of the amount of side etching of the patterned metal layer being substantially zero when the electrolytic etching is carried out with the electrolyte temperature held at $T_1$ (°C.) and $T_2$ (°C.), the value Je of the current density is given by $$Te = a \times Je + b$$

$$a = [(T_2 - T_1)/(J_2 - J_1)] \times (1 \pm 0.1)$$

$$b = [(T_1 J_2 - T_2 J_1)/(J_2 - J_1)] \times (1 \pm 0.1);$$

and wherein the electrolytic etching is carried out until voltage between the metal layer and the electrode increases suddenly.

18. A metal layer patterning method according to claim 16 or 17, wherein the a and b are given by a = 3.00 (1 ± 0.1)
b = 15.00 (1 ± 0.1).

* * * * *